United States Patent [19]

Kolb et al.

[11] 3,718,474

[45] Feb. 27, 1973

[54] LAYERS CROSSLINKABLE BY LIGHT

[75] Inventors: Gunter Kolb; Adolf Schmidt; Robert Schmitz-Josten; Erich Wolff, all of Leverkusen, Germany

[73] Assignee: Agfa-Gevaert Aktiengesellschaft, Leverkusen, Germany

[22] Filed: April 5, 1971

[21] Appl. No.: 131,526

[30] Foreign Application Priority Data

April 23, 1970 Germany ....................P 20 19 598.6

[52] U.S. Cl. ....................96/115 P, 96/35.1, 117/34, 117/93.31, 117/161 UD, 117/161 UF, 204/159.2, 260/93.1

[51] Int. Cl. ..............................................G03c 1/68

[58] Field of Search .....117/93.31, 161 UH, 161 UD, 117/161 UF, 34; 204/159.2; 260/93.1; 96/91 N, 115 R, 35.1, 115 P

[56] References Cited

UNITED STATES PATENTS

| | | | |
|---|---|---|---|
| 2,463,596 | 3/1949 | Butler | 260/93.1 |
| 3,467,523 | 9/1969 | Seidel et al. | 96/91 N |

FOREIGN PATENTS OR APPLICATIONS

| | | | |
|---|---|---|---|
| 767,985 | 2/1957 | Great Britain | 96/91 N |

*Primary Examiner*—Alfred L. Leavitt
*Assistant Examiner*—John H. Newsome
*Attorney*—Connolly and Hutz

[57] ABSTRACT

Soluble polymeric cyclopentadienes form particularly desirable light-sensitive layers, being crosslinked to insoluble condition by light with or without the help of a crosslinking agent.

5 Claims, No Drawings

LAYERS CROSSLINKABLE BY LIGHT

The present invention relates to light-sensitive layers containing polymers having cyclopentene rings, which can be crosslinked by light.

Light-sensitive polymers are known, which are crosslinked at the exposed areas, i.e., they are hardened so as to produce an image. When they are subsequently developed with a solvent which is suitable for the particular polymer, the non-light-struck areas of the layer which have not been crosslinked can be dissolved away, while the exposed crosslinked image parts of the layer are insoluble forming a relief image on the layer support.

Layers of this kind generally contain photocrosslinking agents such as bichromates, azides or cinnamic acid esters. These crosslinking groups may either be combined with the polymer itself or added to the layer in the form of a separate crosslinking agent. Suitable layers contain cyclorubber or condensation products of epichlorohydrin and 2,2-bis-(4-hydroxy-phenyl)-propane as polymers and diaryl azides as crosslinking agents. It is also known to use aromatic carbonyl azide compounds or sulfonyl azide compounds as crosslinking agents.

The known light-sensitive layers have, however, certain disadvantages, for example the sensitivity to light is generally insufficient so that relatively long exposure times are necessary to obtain sufficiently sharp relief images. Other polymers, e.g., those which have been crosslinked with cinnamic acid derivatives, are insufficiently resistant to strong acids so that they cannot be used for the production of images by etching foils of noble metals. Various polymers are sufficiently acid resistant but not sufficiently heat resistant so that they become unusable in the course of storage because they undergo slow thermal crosslinking even without exposure. Other polymers are very highly acid resistant and sufficiently heat resistant but the removal of the unexposed parts of the layer requires the use of solvents in which even the crosslinked parts undergo severe swelling, so that the relief images obtained are not sharp.

It is among the object of the present invention to provide layers which can be crosslinked by light and which have improved sensitivity to light and improved resistance to chemicals and especially to acids.

We now have found a light-sensitive layer which contains a polymer capable of being crosslinked upon exposure in the presence of light-sensitive crosslinking agents, wherein the crosslinkable polymer is a homopolymer or copolymer of cyclopentadiene or derivatives thereof.

Especially advantageous are those polymers in which the cyclopentene ring which is formed by the polymerization of cyclopentadiene is in the 1,2- or 1,3-position within the polymer chain in the form of structural elements of the following formulas:

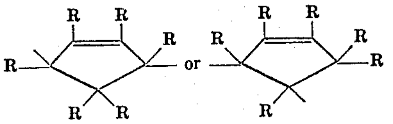

(I) (II)

wherein

R stands for hydrogen or alkyl having preferably one to five carbon atoms; polymers in which at least one R in 1-position to the double band represents hydrogen are especially suitable.

Suitable monomers for the preparation of the cyclopentene polymers to be used according to the invention are both cyclopentadiene itself and any polymerizable substitution products of cyclopentadiene, especially alkyl substituted cyclopentadienes, e.g., 1-methylcyclopentadiene, 2-methylcyclopentadiene, 1,3-dimethylcyclopentadiene, 1,2-dimethylcyclopentadiene, 2,3-dimethylcyclopentadiene and the like.

As already mentioned above, homopolymers of cyclopentadiene or its substitution products or copolymers of these cyclopentadienes with each other or with other comonomers are suitable for the light-sensitive layers. The additional comonomers used may be practically any compounds which are copolymerizable with cyclopentadienes, for example: olefines such as isobutylene, butadiene, isoprene or 2,3-dimethylbutadiene; styrene or its derivatives, such as substitution products with are alkylated on the benzene ring, especially with alkyl having up to three carbon atoms, or halogenated substitution products, e.g., products which are substituted with chlorine or bromine, or nitrated or alkoxylated substitution products; styrenes which are substituted on the ethylene group, such as $\alpha$-methyl styrene, these derivatives may also be substituted on the benzene ring; substituted or unsubstituted indene and substituted or unsubstituted acenaphthylene.

The homopolymers or copolymers to be used according to the invention may be prepared by known methods, e.g., with the aid of cationic initiators of the Friedel-Crafts' type and preferably with boron halides or aluminium halides or their complex compounds with ethers, alcohols and organic acids, especially halogenated carboxylic acids such as mono-, di- or trichloroacetic acid, or with complex compounds consisting of 1 mol of triphenylmethyl chloride and 1 mol of boron halide or aluminium halide, at temperatures of between about −100° C and +50° C. Polymerization may be carried out continuously or discontinuously in solution or in bulk. About 0.3 to 2.5 parts of catalyst are used for 100 parts of monomer mixture. The polymerization temperature employed is preferably between about −80° C and −10° C.

If polymerization is carried out in solution, the solvents used may be n-alkanes, cycloaliphatic compounds having more than five carbon atoms in the ring, aromatic hydrocarbons such as benzene, toluene or xylene or halogenated hydrocarbons such as methylene chloride, chloroform or 1,1-dichloroethane. If this polymerization has been induced cationically, the molecular weight of the products obtained generally increase with the polarity of the reaction medium, i.e., the more solvent with a high dielectric constant is present in the mixture, the higher is the molecular weight obtained. Instead of purely polar or non-polar solvents, solvent mixtures of polar and non-polar components may also be used.

Solvent combinations of polar halogenated hydrocarbons (such as methylene chloride or 1,2-dichloroethane) with aromatic hydrocarbons, n-alkanes or cycloalkanes (such as toluene, n-hexane or cyclohexane) are found to be especially suitable reaction media for the preparation of high molecular weight soluble homopolymers and copolymers of cyclopentadiene.

The molecular weight of the homopolymers or copolymers can be affected not only by the choice of suitable solvents, but, of course, also by the polymerization temperature, low temperatures leading to the formation of higher molecular weight products.

It is therefore possible to obtain high yields of homopolymers and copolymers of cyclopentadiene having viscosity numbers ranging from [η] = 0.1 to [η] = 3 depending on the solvents and polymerization temperatures. The preparation of polycyclopentadienes having viscosity numbers of = 0.4 to 2.0 is described in Macromol. Chem. (1969) 90–102.

The preparation of a few copolymers is described in detail below. Others are obtained by similar methods.

Copolymers of Cyclopentadiene and α-Methyl Styrene 1. 0.3 g of an addition product of $BF_3$ and anisole dissolved in 100 cc of toluene is added dropwise at various temperatures to a mixture of 25 g of cyclopentadiene and 25 g of α-methyl styrene in 250 g of toluene which contains about 30 ppm of water. Copolymers whose intrinsic viscosity varies with the polymerization temperature as shown below are obtained in almost quantitative yields.

Temperature: 0° C −15° C −45° C −78° C

[η], 25° C, toluene 0.2–0.3 0.3–0.6 0.6–0.8 0.8–1.1

The copolymerization parameters are $r_1$ = 1.6 (cyclopentadiene) and $r_2$ = 0.8 (α-methyl styrene).

On fractionating a copolymer having a viscosity of [η] = 0.73, it was found that cyclopentadiene copolymerizes very regularly with α-methyl styrene as indicated below.

| Fraction | % by weight | [η] | Mol % of α-methyl styrene in the copolymer |
|---|---|---|---|
| 1 | 11.3 | 1.63 | 31 % |
| 2 | 14.1 | 1.20 | 32.8 % |
| 3 | 10.0 | 0.93 | 34.1 % |
| 4 | 14.0 | 0.78 | 35 % |
| 5 | 16.8 | 0.59 | 37 % |
| 6 | 10.16 | 0.46 | 38.2 % |
| 7 | 10.2 | 0.28 | 39 % |

Products which are even more uniform in composition can be obtained by varying the rates at which the monomers are added according to the different reactivities of the monomers.

The viscosity numbers of the copolymers also depend on the total monomer concentration $c_o$ at the start of the polymerization and on the composition of the monomer mixture. The viscosity numbers of the copolymers increase with increasing cyclopentadiene content and higher values are obtained for [η] than indicated above.

If polymerization is carried out in m-xylene under the same conditions, the copolymers obtained have substantially lower molecular weights. Even products so prepared at −80° C never have viscosity numbers above [η] = 0.6.

2. 0.4 g of boron fluoride diacetic acid ($BF_3 \cdot 2CH_3COOH$) dissolved in 50 ml of chloroform is added dropwise in the course of 10 minutes to a solution, which has been cooled to −70° C, of 50 g of cyclopentadiene and 50 g of α-methyl styrene in 400 cc of chloroform (anhydrous). Polymerization is completed after 30 minutes. 98 g of a high molecular weight, soluble, gel-free copolymer which has an intrinsic viscosity of [η] = 1.5 are obtained.

If instead of $BF_3$-acetic acid, the addition product of $BF_3$ and diethyl ether is used under otherwise the same conditions, copolymers having viscosity numbers of about [η] = 2 are obtained in yields of 60 to 70 percent.

If 1,2-dichloroethane is used as the solvent instead of chloroform and $BF_3$-diethyl ether is used as catalyst and the polymerization conditions are otherwise kept the same, soluble copolymers which have not been crosslinked and which have viscosity numbers of [η] = 3.0 to 3.5 are obtained in yields of 40 to 50 percent.

Copolymer of Cyclopentadiene and p-Methyl-α-Methyl styrene

A mixture of 32.5 g of p-methyl-α-methyl styrene and 17.5 g of cyclopentadiene in 290 g of toluene is cooled to −78° C. A solution of 1.0 g of $BF_3$-anisole in 50 cc of toluene is added dropwise in the course of 10 minutes. The temperature rises to −60° C. 50 g of a copolymer which has a viscosity of [η] = 0.75 are obtained.

Copolymer of Cyclopentadiene and p-Chloro-α-Methyl Styrene

A mixture of 40 g of p-chloro-α-methyl styrene and 20 g of cyclopentadiene dissolved in 300 g of toluene is cooled to −78° C. A solution of 1.0 g of $BF_3$-trichloroethanol is added dropwise in the course of 10 minutes. The temperature rises up to −50° C. 55 to 60 g of a copolymer which has a viscosity number of [η] = 0.8 to 0.9 are obtained.

Copolymer of Cyclopentadiene and Indene

Fifty g of indene and 50 g of cyclopentadiene are dissolved in 283 g of toluene, and a solution of 2 g of $BF_3$-anisole adduct dissolved in 100 cc of toluene is added dropwise in the course of 50 minutes. The temperature is maintained at −78° C. A copolymer having viscosity numbers of [η] = 0.6 to 0.8 is obtained.

Copolymer of Cyclopentadiene with Isobutylene and α-Methyl Styrene

A mixture of 35 g of cyclopentadiene, 35 g of isobutylene and 35 g of α-methyl styrene is dissolved in 400 cc of methylene chloride, and a solution of 1.4 g of trichloroethanol-$BF_3$ adduct dissolved in 100 cc of methylene chloride is added dropwise at −70° C. 90 g of a copolymer which has a viscosity number of [η] = 0.3 to 0.4 are obtained.

Copolymer of Cyclopentadiene and Acenaphthylene

Seventeen g of cyclopentadiene and 8 g of acenaphthylene are dissolved in 145 g of toluene. A solution of 0.25 g of $BF_3$-anisole dissolved in 100 ml of toluene is added dropwise at −78° C in the course of 20 minutes. The copolymer, which is obtained in 80 percent yield, has viscosity numbers of [η] = 0.7 to 0.8.

Copolymer of 1,3-Dimethylcyclopentadiene and α-Methyl Styrene

Forty g of 1,3-dimethylcyclopentadiene and 20 g of α-methyl styrene are dissolved in 250 cc of toluene and the mixture is cooled to −78° C. 1.5 g of $BF_3$-anisole dissolved in 100 cc of toluene are now added dropwise. The temperature rises to about −40° C. A soluble copolymer (viscosity numbers [η] = 0.7 to 1.0) is obtained in quantitative yield.

Layers which can be crosslinked by light and which have excellent mechanical properties, excellent sensitivity to light and surprisingly high acid resistance are obtained by means of the homopolymers or copolymers described above. Copolymers of cyclopentadienes with other comonomers are especially suitable owing to their superior stability in storage compared with that of homopolymers.

The molar ratio of cyclopentadiene and comonomers may vary within side limits. The general rule applies that the higher the molar concentration of a cyclopentadiene in the polymer, the greater is the light sensitivity of the layers. Layers which can be crosslinked by light can therefore be produced with the required sensitivity to light according to the requirements of the particular reproduction process for which the light-sensitive layer is to be used.

Comonomers which contain the cyclopentadiene component at a molar concentration of between 30 and 70 mols per cent are preferred for many different requirements.

The molecular weight of the polymers used according to the invention may also vary within wide limits. Molecular weights ranging between 5,000 and 1,500,000 have generally been found suitable. The choice of polymers having a suitable molecular weight generally depends on the purpose for which they are to be used, i.e., the requirements of the particular reproduction process. In general, higher molecular weight polymers are especially suitable in cases where only short exposure times are possible, i.e., where highly sensitive light-crosslinkable layers are required. It is therefore also possible to prepare polymers which have the required sensitivity by suitable choice of the molecular weight. The molecular weight range indicated above corresponds to viscosity numbers (intrinsic viscosity) of $[\eta] = 0.4$ to 1.8.

The layers according to the invention which can be crosslinked by light have such a high sensitivity to light that the use of special crosslinking agents is not necessary. In many cases, however, it is advantageous to modify the properties of the layers by using separate light-sensitive crosslinking agents.

Suitable for this purpose are, for example, low-molecular organic azide compounds, especially aromatic compounds which contain azide, carbonyl azide, sulfonyl azide or azido formate groups. Compounds of this type have been described, for example, in German Pat. Nos. 954,308; 1,079,950 and 1,285,306 and in British Pat. No. 767,985. The optimum combinations of crosslinking agents and polymers which can be crosslinked can easily be determined by a few simple commonly used laboratory tests.

Low molecular weight preferably low molecular weight benzene azido compounds which contain at least two azide groups are suitable for use as crosslinking agents. The following are mentioned as examples:

4,4'-diazido stilbene
1,4-diazido benzene
4,4'-diazido benzophenone
4,4'-diazido diphenylmethane
4,4'-diazido dibenzal acetone
1,3-di-(40'-azidophenyl)-2,3-propen-1-one
1,2-di-(4-azidocinnamoyloxy)-ethane
4,4'-diazido dibenzal cyclohexanone, and
2,6-di-(4'-azido benzal)-4-methylcyclohexanone;

furthermore, sulfazides, e.g., 1,4-butane disulfazide, and especially 1,3-benzene disulfazide and derivatives thereof such as toluene-2,4-disulfazide or 4-amino-6-chloro-m-benzene disulfazides; sulfazides which contain two phenyl groups may also be used, in particular 4,4'-diphenyl disulfazide, 4,4'-diphenyl ether disulfazide and especially methylene-bis-(4-phenylene sulfazide), 4,4'-dichlorodiphenyl-2,6'-disulfazide or 4,4'-dichlorodiphenyl-3,5'-disulfazide; naphthalene disulfazides are also especially suitable, e.g., 1,5-naphthylene disulfazide, 2,6-naphthylene disulfazide or 2,7-naphthylene disulfazide.

The concentration of crosslinking agent in the layer of film-forming polymers may vary within wide limits according to the nature of the components in this system and the required results. Concentrations of about 0.5 to 25 percent by weight of the azido crosslinking agent in the layer are sufficient for the usual purposes. The optimum concentration for any particular case can be determined by a few simple tests. It depends primarily on the nature and molecular weight of the polymer, the chemical nature of the crosslinking agent and especially on the required thickness of the layer.

The light sensitivity of the layers according to the invention can be considerably increased by the addition of sensitizers of the type normally used for this purpose, e.g., Michler's ketone, dimethylamino benzaldehyde, 4-H-quinolizin-4-one, compounds from the group of naphthothiazolines, cyanines, triphenylmethane dyes or the compounds described in French Pat. No. 1,513,822, British Pat. No. 1,148,636 and Belgian Pat. No. 735,896.

The layers produced according to the invention are exposed with the usual sources of light used in reproduction work, such as carbon arc lamps, Xenon lamps and high pressure mercury vapor lamps. These sources of light advantageously contain a proportion of ultraviolet light which is especially effective for photocrosslinking, in addition to visible light. Development of the exposed layers is generally carried out with organic solvents of suitable constitution which may but need not necessarily be the same as or similar to the solvents used for the polymers before they have been crosslinked. Solvents such as butyl acetone, cyclohexanone, benzene, xylene, glycol ethers, glycol acetates or butanones, in which the crosslinked parts of the layer undergo little or no swelling, are preferably used.

The light-sensitive polymers according to the invention may be present in the layer either alone or as a physical mixture with other polymers. A mixture in many cases affords certain advantages because it is possible to prepare mixtures which have certain advantageous properties such as solubility in various solvents, improved bonding on special layer supports, etc. When choosing suitable components for the mixture, care must naturally be taken to ensure that they are compatible with the cyclopentadiene polymer, and in particular no separation of the components must occur on formation of the film.

Especially suitable components for the mixtures are homopolymers or copolymers of vinyl acetate, ethylene, derivatives of acrylic or methacrylic acid such as acrylic acid amide or methacrylic acid amide, esters of these acids, especially esters with short chained aliphatic alcohols, or nitriles of these acids, or butadiene, isoprene, styrene or vinyl alcohol. As specific examples there may be mentioned copolymers of vinyl acetate, vinyl alcohol, ethylene and norbornadiene and copolymers of butadiene or isoprene with styrene and/or acrylonitrile. Mixtures with polymers which are not sensitive to light also have the advantage that unwanted premature crosslinking of the light-sensitive polymers during preparation of the layer can be practically completely suppressed.

The layers which can be crosslinked by light are prepared by dissolving the polymers and adding the crosslinking agent to the solution. The crosslinking agent may be in the form of a solution or in a heterogeneously distributed form. The solution is then applied to the required layer support in the usual manner and the solvent is evaporated. With suitable choice of layer binders, it is also possible to produce self-supporting layers.

The layer supports may be metal foils of copper, aluminium, zinc, magnesium, steel and the like, paper, glass or foils of polymer products such as cellulose esters, polyvinyl acetate, polystyrene and polycarbonates, especially those based on bis-phenylol alkanes, polyesters, especially those based on polyethylene terephthalate, and polyamides such as nylon and the like. Materials which have a mesh-like structure such as metal meshes are also suitable for use as supports.

The layers according to the invention which can be crosslinked by light may be used for the production of relief images or for printing forms for relief printing, intaglio printing or planographic printing. They may be used for the offset printing process, screen printing, lithographic printing plates or any other printing processes which require a relief image and photogravure processes. One important application of the layers according to the invention is the production of so-called printed circuits.

The thickness of the layer which can be crosslinked by light may vary within wide limits. Thicknesses of between 0.001 and about 0.7 mm are sufficient for the usual processes. Thicker layers of about 0.25 to 1.5 mm may be used for relief printing forms.

EXAMPLE 1

Light-Sensitive Material

The following copolymers of cyclopentadiene and α-methyl styrene are prepared by the first process indicated above:

| Polymer | Proportion by weight of α-methyl styrene: cyclopentadiene | Polymerization temperature in °C. | [η] |
|---|---|---|---|
| 1 | 50 : 50 | −80 | 0.80 |
| 2 | 60 : 40 | −80 | 0.93 |
| 3 | 40 : 60 | −80 | 0.88 |
| 4 | 30 : 70 | −20 | 0.28 |
| 5 | 30 : 70 | −30 | 0.42 |
| 6 | 30 : 70 | −40 | 0.74 |
| 7 | 30 : 70 | −60 | 1.70 |

The polymers are dissolved in xylene, and 2 percent by weight of 4,4′-diazido-dibenzal cyclohexanone, based on the weight of film-forming polymer, are added as crosslinking agent. These solutions are whirl-coated (200 revs/min) on aluminium foils and dried.

Processing

The various samples are exposed in close contact in a vacuum frame through a grey step wedge having a density difference of 0.15 between the individual steps. The layers are then developed in xylene for 2 minutes. The results are summarized in the table below.

| Polymer | Layer Thickness in microns | Exposure time (min.) | Steps Density 0.15 |
|---|---|---|---|
| 1 | 2.25 | 1 | 7 |
| 2 | 3.20 | 1 | 8 |
| 3 | 2.75 | 1 | 7 |
| 4 | 2.95 | 4 | 4 |
| 5 | 1.25 | 4 | 7 |
| 6 | 1.25 | 4 | 8 |
| 7 | 8.35 | 4 | 13 |

Sharp positive relief images of the step wedge are obtained. The relief images have excellent resistance to the etching agents normally used on aluminium supports, e.g., strongly alkaline aqueous baths. Similar results are obtained when the aluminium foils are replaced by copper. In this case, etching may be carried out, e.g., with aqueous solutions of ammonium persulphate, hydrogen peroxide or iron (III) chloride.

EXAMPLE 2

Light-Sensitive Material

Copolymers of cyclopentadiene and indene are also prepared by the process described above. The polymers are described in the table below.

| Polymer | Proportion by weight (indene: cyclopentadiene) | Polymerization temperature in °C. | [η] |
|---|---|---|---|
| 1 | 70 : 30 | −78 | 0.7 |
| 2 | 80 : 20 | −78 | 0.8 |
| 3 | 70 : 30 | −40 | 0.4 |

The polymers are dissolved in xylene, and 2 percent by weight, based on the film-forming polymer, of 4,4′-diazido-dibenzal cyclohexanone are added as crosslinking agent to the solution. These solutions are whirl-coated (200 revs/min) on aluminium foils and dried.

Processing

The various samples are exposed in close contact in a vacuum frame through a grey step wedge having a density difference of 0.15 between the individual steps. The layers are then developed in xylene for 2 minutes. The results are summarized in the table below.

| Sample | Exposure time (min) | Steps Density 0.15 |
|---|---|---|
| 1 | 4 | 10 |
| 2 | 4 | 9 |
| 3 | 4 | 9 |

EXAMPLE 3

Light-Sensitive Layer

Two percent by weight of 4,4′-diazido-dibenzal cyclohexanone, based on the weight of dry film-forming polymer, are added to a 5.0 percent solution of polycyclopentadiene (viscosity number η = 0.80, molecular weight 150,000). A thin copper foil is coated with this solution and the layer is dried for 5 minutes in a drying cupboard at 80° C. The resulting thickness of the layer is between 2 and 4 microns.

Processing

The layer described above is exposed for 4 minutes through a grey wedge (density steps 0.15) and then developed in a mixture of xylene and mineral spirits (development time 2 minutes). After washing the developed layer with water and blowing it dry with compressed air, a sharp positive relief image of the step wedge is obtained. Sensitivity 14 steps.

EXAMPLE 4

Light-Sensitive Material 5.0 g of polycyclopentadiene (viscosity number $\eta$ = 0.80, molecular weight 150,000) and 3.0 g of polystyrene (molecular weight 200,000) are dissolved in 200 g of toluene and sensitized with 2 percent by weight, based on the weight of dry film-forming polymer, of 4,4′-diazidodibenzal cyclohexanone. A thin copper foil is coated with this solution and the layer is dried in a drying cupboard at 80° C. The resulting thickness of the layer is between 2 and 4 microns.

Processing

The layer described above is exposed for 4 minutes in a Chem-Cut vacuum frame through a grey wedge (density steps 0.15) and then developed for 2 minutes in a mixture of xylene and mineral spirits. When the developed layer has been washed with water and blown dry with compressed air, a sharp relief image of the step wedge is obtained. Sensitivity: 12 steps.

We claim:

1. In an exposure assembly for imagewise exposing a layer of a solid soluble polymer that becomes crosslinked to insoluble condition where light struck, the improvement according to which the soluble polymer is a cyclopentadiene polymer having recurring units of the formulas:

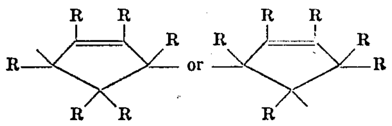

wherein R stands for hydrogen or alkyl having up to five carbon atoms, and having a molecular weight between about 5,000 and 1,500,000.

2. The combination of claim 1 in which the polymer is a polymer of cyclopentadiene, methyl-cyclopentadiene or dimethyl-cyclopentadiene.

3. The combination of claim 1 in which the layer also contains as light-sensitive crosslinking agent a low molecular weight benzene azido compound containing at least two azide groups.

4. In an exposure assembly for imagewise exposing a layer of a solid soluble copolymer that becomes crosslinked to insoluble condition where light struck, the improvement according to which the soluble copolymer has a molecular weight of about 5,000 to 1,500,000, is a copolymer of cyclopentadiene with a styrene, and contains about 30 to 70 mol percent of cyclopentadiene.

5. In an exposure assembly for imagewise exposing a layer of a solid solution copolymer that becomes crosslinked to insoluble condition where light struck, the improvement according to which the soluble copolymer has a molecular weight of about 5,000 to 1,500,000, is a copolymer of cyclopentadiene with indene or acenaphthylene, and contains about 30 to 70 mol percent of cyclopentadiene.

* * * * *